(12) United States Patent
Gambhir et al.

(10) Patent No.: US 10,686,427 B1
(45) Date of Patent: Jun. 16, 2020

(54) RECONFIGURABLE ANALOG FILTER WITH OFFSET COMPENSATION

(71) Applicant: Marvell International Ltd., Hamilton (BM)

(72) Inventors: Manisha Gambhir, Cupertino, CA (US); Ahmed Hesham Mostafa, San Jose, CA (US); Jingren Gu, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/262,487

(22) Filed: Jan. 30, 2019

Related U.S. Application Data

(60) Provisional application No. 62/721,407, filed on Aug. 22, 2018.

(51) Int. Cl.
*H03H 11/04* (2006.01)
*H03F 3/45* (2006.01)
*G11B 20/10* (2006.01)
*H03M 1/66* (2006.01)

(52) U.S. Cl.
CPC ... *H03H 11/0472* (2013.01); *G11B 20/10037* (2013.01); *H03F 3/45269* (2013.01); *H03F 2200/375* (2013.01); *H03F 2203/45212* (2013.01); *H03M 1/66* (2013.01)

(58) Field of Classification Search
CPC .......... H03H 11/0472; G11C 20/10037; H03F 3/45269; H03F 2200/375; H03F 2203/45212; H03M 1/66
See application file for complete search history.

(56) References Cited

U.S. PATENT DOCUMENTS

| | | | | |
|---|---|---|---|---|
| 6,311,051 B1 * | 10/2001 | Jung | ..................... | H04L 25/063 375/319 |
| 6,556,028 B1 * | 4/2003 | Umanskiy | .............. | G01R 29/22 324/727 |
| 7,409,189 B2 * | 8/2008 | Song | ..................... | H04B 17/21 375/319 |
| 7,538,967 B1 | 5/2009 | Yang et al. | | |
| 7,869,312 B1 | 1/2011 | Li et al. | | |
| 7,876,147 B1 * | 1/2011 | An | ..................... | H03F 3/45179 327/552 |
| 8,000,193 B1 | 8/2011 | Liu et al. | | |
| 8,958,276 B1 | 2/2015 | Pandana et al. | | |

* cited by examiner

*Primary Examiner* — Dinh T Le

(57) ABSTRACT

During operation of an analog filter having one or more filter stages is configured to operate in a first configuration. Configuring the analog filter to operate in the first filter configuration includes configuring one or both of i) a filter response of the analog filter and ii) a filter bandwidth of the analog filter. A first set of one or more direct current (DC) offset correction codes corresponding to the first filter configuration are retrieved from a memory. The one or more DC offset correction codes in the first set are converted to one or more first analog DC offset correction signals. While operating the analog filter configured in the first configuration, the one or more first analog DC offset correction signals are applied to the one or more filter stages of the analog filter.

20 Claims, 12 Drawing Sheets

US 10,686,427 B1

RECONFIGURABLE ANALOG FILTER WITH OFFSET COMPENSATION

CROSS REFERENCES TO RELATED APPLICATIONS

This claims the benefit of U.S. Provisional Patent App. No. 62/721,407, entitled "Highly Flexible Offset Compensation Scheme for a Widely Programmable, Reconfigurable Response, Multi-Stage Filter," filed on Aug. 22, 2018, the disclosure of which is hereby expressly incorporated herein by reference in its entirety.

FIELD OF TECHNOLOGY

The present disclosure relates analog filters and, more particularly, to offset compensation in reconfigurable response analog filters.

BACKGROUND

A typical analog filter, such as an analog filter utilized in a front-end application, may consist of multiple filter stages of filtering and/or built in equalization. Such analog filters are often reconfigurable and adaptable in terms of the shape of the transfer function of the filter, pole-zero locations, equalization type, bandwidth, etc. to adapt to change of operation, data rate, usage and application, for example. For example, the bandwidth of an analog filter may be scaled in proportion to the data rate of the incoming signal. As another example, the transfer function of the analog filter may be reconfigured, for example from a band-pass to a low-pass or equalizing type, based on incoming signal characteristics and application. Application and usage of such adaptive analog filters presents challenges. For example, the direct current (DC) offset associated with such an adaptive filter may vary as the filter's configuration and/or bandwidth is changed. In a typical system, to provide DC offset corrections for the various configuration of the analog filter, a dedicated auto-zero procedure is performed every time the filter is reconfigured in terms of filter response type and/or bandwidth of the analog filter. Such auto-zero schemes, however, add time overhead to the usage of a channel in which the filter may be utilized. Moreover, such auto-zero schemes suffer from transient errors, such as errors caused by noise and signal couplings, and may result in time varying characteristics of the channel in which the filter may be utilized.

SUMMARY

In an embodiment, a method of operating an analog filter having one or more filter stages includes: configuring the analog filter to operate in a first configuration, including configuring one or both of i) a filter response of the analog filter and ii) a filter bandwidth of the analog filter; retrieving, from a memory, a first set of one or more direct current (DC) offset correction codes corresponding to the first filter configuration; converting, with one or more digital to analog converters (DACs), the one or more DC offset correction codes in the first set to one or more first analog DC offset correction signals; and while operating the analog filter configured in the first configuration, applying the one or more first analog DC offset correction signals to the one or more filter stages of the analog filter.

In another embodiment, a filter system comprises: an analog filter including one or more filter stages; a memory configured to store direct current (DC) offset correction codes corresponding to a plurality of filter configurations, each filter configuration defining one or both of i) a filter response of the analog filter and ii) a filter bandwidth of the analog filter; a memory controller configured to, when the filter is configured to operate in a first filter configuration of the plurality of filter configurations, retrieve, from the memory, a first set of one or more direct current (DC) offset correction codes corresponding to the first filter configuration; and one or more digital to analog converters (DACs) configured to convert the one or more DC offset correction codes in the first set to one or more first analog DC offset correction signals, wherein the one or more first analog DC offset correction signals are applied to the one or more filter stages of the analog filter while the analog filter operates in the first filter configuration.

DETAILED DESCRIPTION

In embodiments described below, calibration of a reconfigurable analog filter is performed prior to operation of the filter to determine direct current (DC) offset correction values corresponding to different configurations of the analog filter. In an embodiment, the determined DC offset correction values are stored in digital form in a memory for use during operation of the analog filter. In such an embodiment, when the analog filter is reconfigured during operation of the analog filter, appropriate DC offset correction codes are retrieved from the memory, converted to analog DC offset correction signals, and provided to the analog filter to compensate for (e.g., zero out) the DC offset in the reconfigured configuration of the analog filter. As an example, in an magnetic disk drive system application, pre-calibration of an analog filter eliminates or reduces the time of auto-zero periods that typically occur when the filter is reconfigured due to changes in the data rate as a magnetic head progresses along the radial axis of a disc and/or when the filter is reconfigured to change its response due to a switch from a data sector to a service sector, and vice versa. The pre-calibration and DC offset correction determination for various filter configurations prior to operation of the analog filter eliminate, or at least reduce, the time duration of auto-zero periods that are typically needed to be performed when an analog filter is reconfigured to change its response and/or bandwidth during operation of the analog filter, in at least some embodiments. In at least some embodiments, the pre-calibration and DC offset correction determination for various filter configurations prior to operation of the analog filter eliminate or reduce transient errors typically associated with analog auto-zero schemes utilized in typical reconfigurable analog filter systems.

Although embodiments of DC offset calibration techniques and pre-calibrated analog filters are described herein as being used in magnetic disk drive systems, DC offset calibration techniques and pre-calibrated analog filters are not limited to magnetic disk drive systems and are used with reconfigurable analog filters in other suitable applications, in other embodiments.

Figure 1:
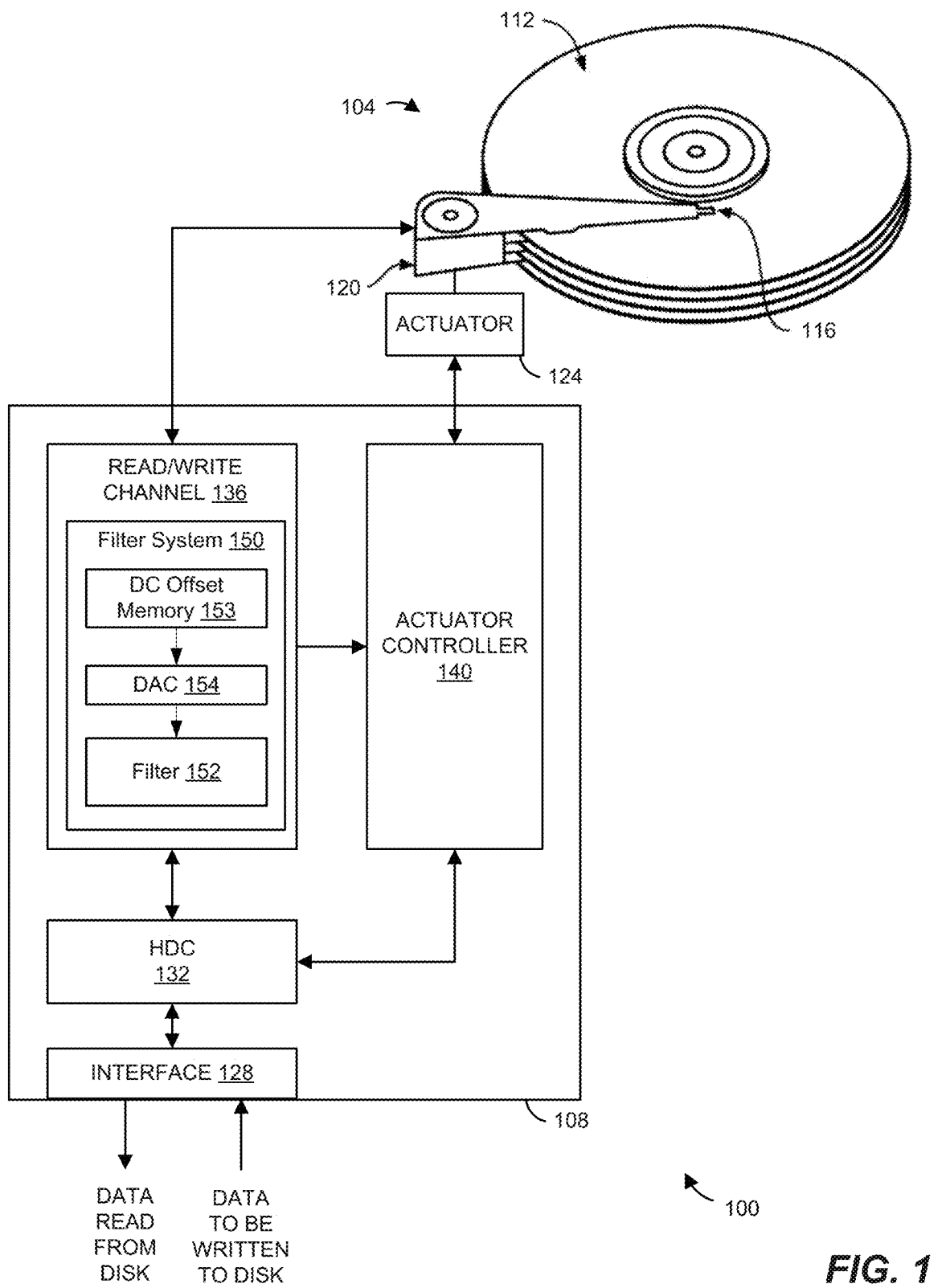
FIG. 1 is a block diagram of an example magnetic disk drive system, according to an embodiment.

FIG. 1 is a block diagram of an example magnetic disk drive system 100, according to an embodiment. The magnetic disk drive system 100 includes a head-disk assembly 104 and a hard disk control system 108. The hard-disk assembly 104, in turn, includes one or more magnetic disks 112 and one or more corresponding magnetic heads 116 on a moving arm 120. The moving arm 120 is coupled to an actuator 124 that is used to position the magnetic heads 116 over the magnetic disks 112, in an embodiment. The hard disk control system 108 includes an interface 128 that receives data to be written to the one or more magnetic disks 112 and transmits data read from the one or more magnetic disks 112. The interface 128 is communicatively coupled to a microprocessor of a computing system such as a server, a personal computer, a personal digital assistant (PDA), etc., or of a consumer electronics device such as a cellular phone, a set top box, a gaming system, etc., to allow the microprocessor to store data to and read data from the one or more magnetic disks 112, in various embodiments. The interface 128 is coupled to a hard disk controller (HDC) 132. The HDC 132 is in turn coupled to a read/write channel device (RWC) 136 and an actuator controller 140. The RWC 136 is coupled to the magnetic heads 116 and the actuator controller 140 is coupled to the actuator 124. Additionally, the RWC 136 is coupled to the actuator controller 140, in an embodiment. The RWC 136 includes a read channel device, in an embodiment.

Data to be written to the disks 112 are received via the interface 128. The HDC 132 transmits signals to the actuator controller 140 indicating the disk and the track on which data is to be written. During positioning, the RWC 136 reads position signal information from the appropriate disk 112 and provides this position signal information to the actuator controller 140. The actuator controller 140 uses the position signal information from the RWC 136 to accurately position the appropriate magnetic head 116 to the desired track. Meanwhile, the HDC 132 provides the data to be written to the RWC 136. Once the magnetic heads 116 are appropriately positioned, the RWC 136 generates an analog write signal and provides it to the appropriate magnetic head 116 such that the data is magnetically stored on the disk 112 at the desired position.

When data is to be read from one of the disks 112, the microprocessor of the computing device or consumer electronics device provides a request to the interface 128, indicating the data to be read. The interface 128 provides the indication to the HDC 132. Then, the HDC 132 transmits signals to the actuator controller 140 indicating the disk and the track from which data is to be read. During positioning, the RWC 136 generates position signals based on position information written on the disk 112 and provides these position signals to the actuator controller 140. The actuator controller 140 uses the position signals to accurately position the magnetic head 116 to a center of a desired track. Additionally, the HDC 132 indicates to the RWC 136 from which of the disks 112 (if there are multiple disks) to read and when to begin reading so that data from an appropriate portion on the disk 112 will be read. In response, at the appropriate time, the RWC 136 generates a digital signal from an analog signal received from the magnetic head 116. This digital signal is provided to the HDC 132. The HDC 132 provides the retrieved data to the interface 128, which in turn provides it to the requesting microprocessor.

Figure 2:
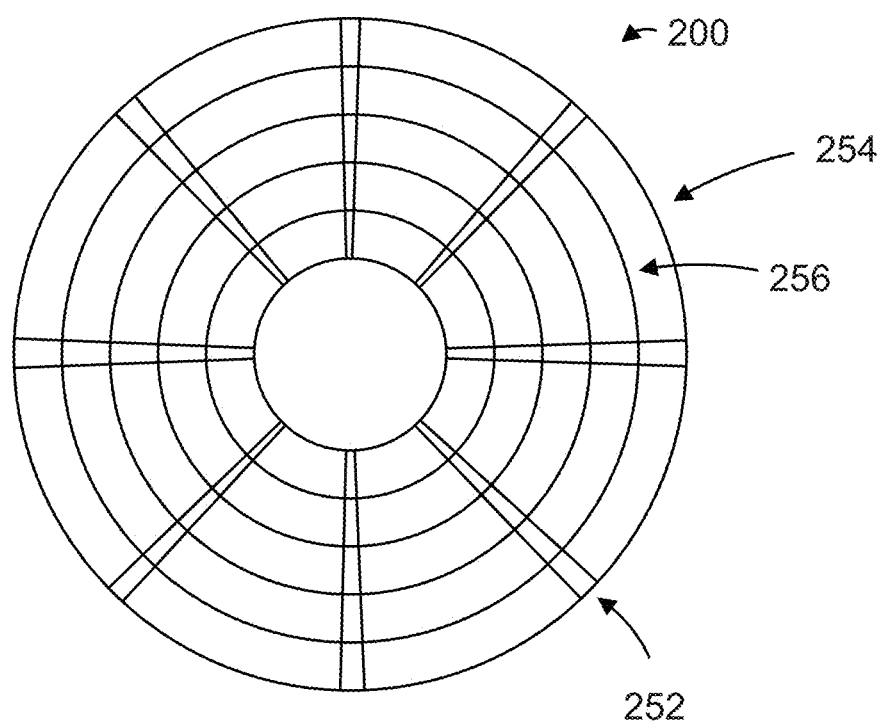
FIG. 2 is an illustration of an example magnetic media disk that is utilized in the disk drive system of FIG. 1, according to an embodiment.

FIG. 2 is an illustration of an example magnetic media disk 200 that is utilized in the disk drive system 100 of FIG. 1, according to an embodiment. The disk 200 includes a plurality of servo field areas 252 (also sometimes referred to herein as "servo sectors") and a plurality of data areas 254 (also sometimes referred to herein as "data sectors"), in an embodiment. Servo sectors 252 and data sectors 254 are wedge shaped and generally radiate outwardly from the center of the disk 200. Additionally, the disk 200 is generally partitioned into a plurality of concentric regions referred to as tracks 256. A servo sector 252 within a particular track 256 is sometimes referred to as a servo wedge. Each servo wedge includes data which is pre-written on the disk 200 during manufacturing, in an embodiment. Data which is pre-written in a servo wedge on the disk 200 includes data concerning the location of the servo wedge on the disk 200, such as the particular servo sector 252 to which the servo wedge corresponds and the track in which the servo wedge is located. The servo wedge data is used by the hard disk system to position the magnetic head 116 during read and write operations, in an embodiment. Data to be stored on the disk 200 is written in the tracks 254 in data sectors 254 between the servo sectors 252.

Referring to FIGS. 1 and 2, in an embodiment, the read/write channel 136 includes or is coupled to a filter system 150. The filter system 150 includes an analog filter 152 coupled to a DC offset correction memory 153 via a digital to analog converter (DAC) 154. Although in the embodiment of FIG. 1, the DC offset correction memory 153 and the DAC 154 are included in the filter system 150, the DC offset correction memory 153 and/or the DAC 154 are external to the filter system 150 in other embodiments. In an embodiment, the analog filter 152 is configurable and/or programmable to dynamically control filter response (e.g., transfer function) and/or filter bandwidth of the analog filter 152 during operation of the filter system 150. In various embodiments, the HDC controller 132 or another suitable controller is configured to dynamically control the filter configuration to provide particular filter responses and/or particular bandwidths of the analog filter 152 during operation of the filter system 150. In an embodiment, the filter configuration is adapted to the incoming signal to the filter system 150. For example, the filter configuration depends on whether the incoming signal includes position data read from a servo sector 252 of a disc 112 or data read from a data sector 254 of a disc 112, in an embodiment. Additionally or alternatively, the filter configuration depends on the rate at which data is read from a disc 112. For example, when a generally highly tonal signature is to be read from a servo sector 252 of a disc 112, the HDC 132 reconfigures the response of the analog filter 152 to provide band-pass filtering needed for the tonal nature of the incoming signal, in an embodiment. On the other hand, when data is to be read from a data sector 254 of a disc 112, the HDC 132 reconfigures the response of the analog filter 152 to provide equalization and/or boosting needed to equalize and/or boost generally highly overlapping pulses of data, in an embodiment. Additionally or alternatively, the HDC 132 reconfigures the analog filter 152 to vary the filter bandwidth depending on the data rate at which data is read from a disc 112, for example based on location along the radial axis of the disc 112 from which the data is read. For example, in an embodiment, the HDC 132 reconfigures the analog filter 152 to increase the filter bandwidth as the location from which the data is read moves outward along the radial axis. Similarly, the HDC 132 reconfigures the analog filter 152 to decrease the filter bandwidth as the location at which the data is written to or from which the data is read moves inward along the radial axis, in an embodiment.

Generally, when the analog filter 152 is reconfigured, one or more filter characteristics also change. For example, DC offset introduced by the filter varies with different filter configurations. Accordingly, DC offset compensation needed to reduce or eliminate the DC offset changes as the filter configuration is changed. One approach to reducing or eliminating the DC offset is to perform a dedicated auto-zero procedure each time an analog filter is reconfigured. Such auto-zero procedure, however, adds time overhead to the usage of the channel in which the analog filter is utilized, and may introduce transient errors, such as errors caused by noise and signal couplings, that may result in time varying characteristics of the channel. In an embodiment, the filter system 150 is configured to perform a calibration process prior to operation of the analog filter 152 to determine DC offset correction values for different filter configurations of the analog filter 152 for subsequent use during operation of the filter system 150. The calibration process is a one-time calibration process performed by the filter system 150 once, for example at power-up of the filter system 150, in an embodiment. The filter system 150 is configured to perform the calibration process automatically at power up, for example. The filter system 150 is configured to store the determined DC offset correction values for the different filter configurations of the analog filter 152 is the DC offset correction memory 152, in an embodiment. Subsequently, when the filter configuration of the analog filter 152 is changed during operation, the pre-stored DC offset correction values corresponding to the new filter configuration are automatically retrieved from the DC offset correction memory 153, in an embodiment. The retrieved DC offset correction values are converted to analog DC offset correction signals by the DAC 154 and are applied to the analog filter 152 to zero-out (e.g., eliminate or reduce) the DC offset introduced by the reconfigured analog filter 152. Performing the calibration prior to operation of the analog filter 152 eliminates auto-zero time periods that occur in a typical system each time an analog filter configuration is changed, in at least some embodiments Eliminating auto-zero time periods, in turn, reduces overhead associated with reading and writing of data and improves format efficiency (e.g., defined as ratio of bits allocated to data sectors to bits allocated to servo non-data patterns used for operational functions in the magnetic disk drive system, such as wedge sectors, data preamble, sync marc, etc) Eliminating auto-zeroing also eliminates transient errors such as noise and signal couplings that change channel characteristics over multiple data and servo sectors in a typical system, thereby improving DC offset compensation in the analog filter and overall performance of the system, in some embodiments.

Figure 3A:
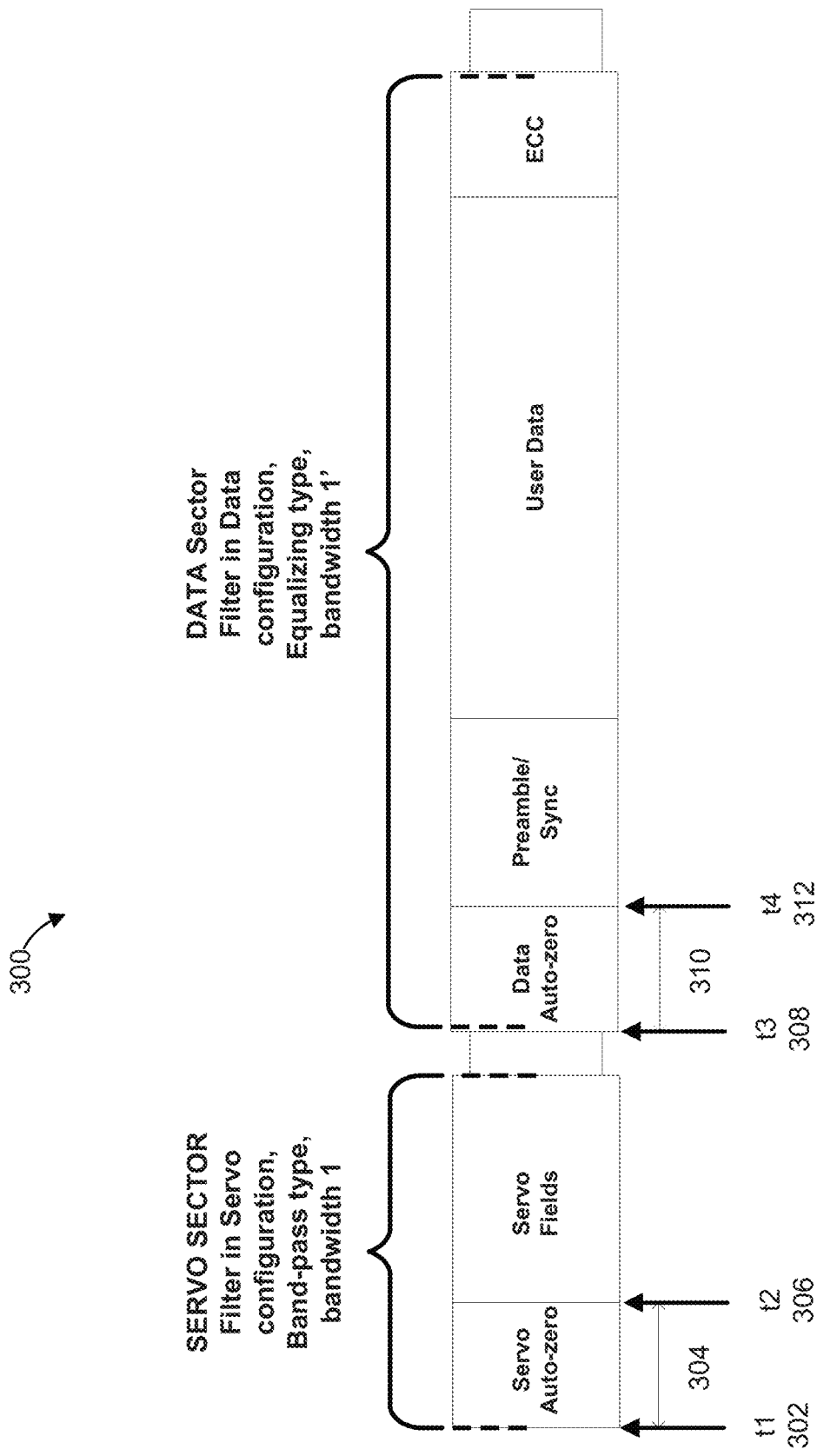
FIG. 3A is a time diagram of operation of a magnetic disk drive system with a reconfigurable analog filter.
Figure 3B:
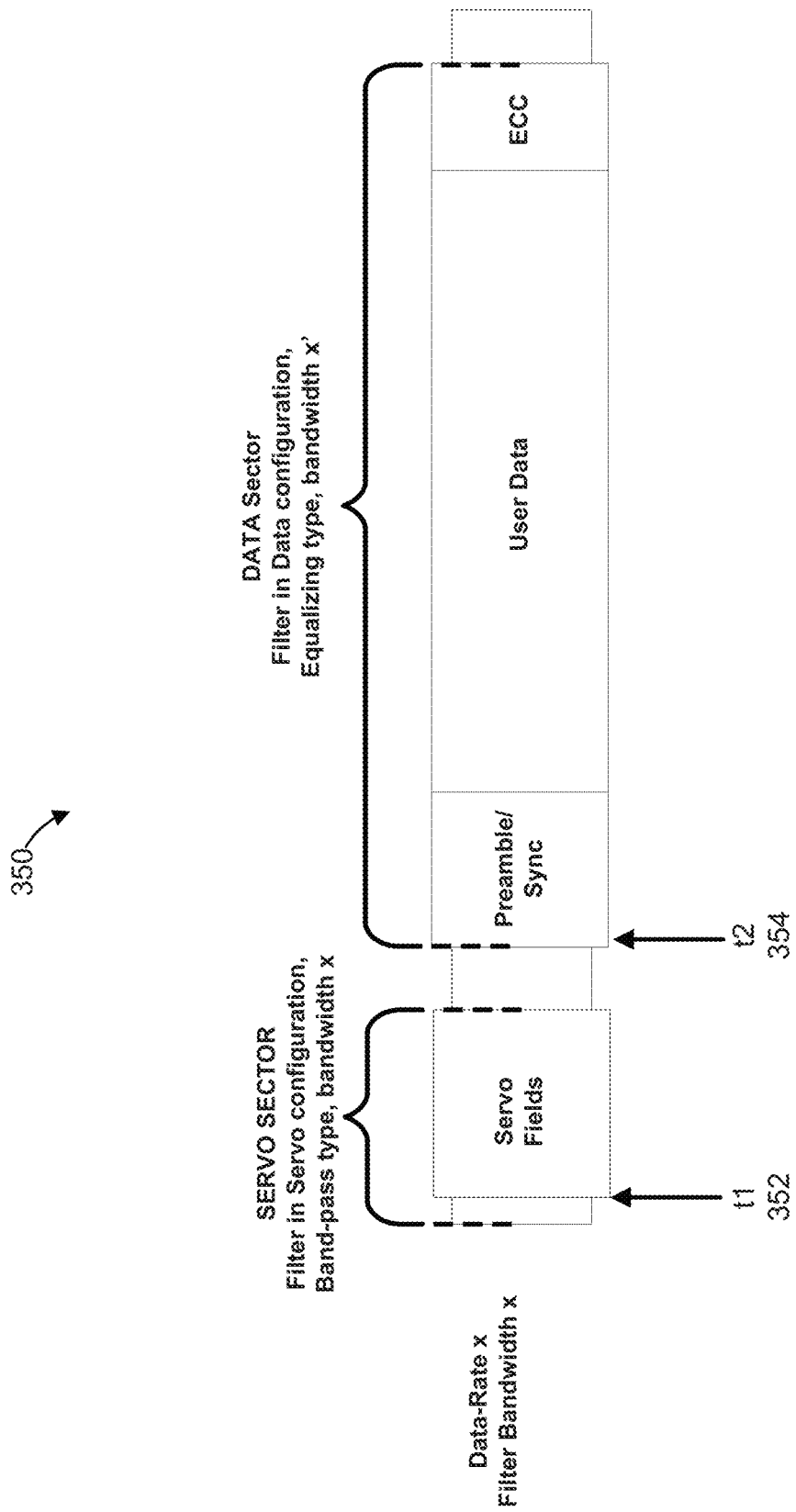
FIG. 3B is a time diagram of operation of the magnetic disk drive system of FIG. 1, according to an embodiment.

FIG. 3A is a time diagram 300 of operation of a magnetic disk drive system with a reconfigurable analog filter. In the time diagram 300, at a time t1 302, the analog filter is reconfigured to provide band-pass response for servo operation. The time t1 302 is followed by a servo auto-zero time period 304 during which the analog filter performs an auto-zero procedure to measure a DC offset in the new filter configuration. Thus, operations associated with reading/processing of data from the servo region is delayed until a time t2 306, when measurement of DC offset is completed. Similarly, a time t3 308, at which the analog filter is reconfigured to provide equalization response for data operation, is followed by a data auto-zero time period 310 during which the analog filter performs an auto-zero procedure to measure a DC offset of the new filter configuration. Thus, operations associated with reading/processing of data from the data region is delayed until a time t4 312, when the measurement of DC offset is completed. Such dedicated auto-zero time periods occur every time the filter is switched from servo operation to data operation and vice-versa, and as the filter's bandwidth changes to track the changing data rate with changing location along the radial axis of the disc from which the data is being read. Moreover, the duration of the auto-zero time periods in relation to the duration of time periods for useful operation (e.g., reading servo information and data) increases with increasing data rate as the location moves from outer to inner radius along the disk. FIG. 3B is a time diagram 350 of operation of the magnetic disk drive system 100 of FIG. 1, according to an embodiment. In the time diagram 350, at a time t1 352, the analog filter 152 of the filter system 150 is reconfigured for servo operation. For example, the analog filter 152 is reconfigured as a band-pass filter for filtering servo data signals, in an embodiment. Concurrently with reconfiguring the analog filter 152 to provide the band-pass response for servo operation, DC offset correction values corresponding to the new configuration/bandwidth of the analog filter 152 are retrieved from the DC offset correction memory 153 and corresponding analog DC offset correction signals are applied to the analog filter 152. Accordingly, a servo auto-zero time period is not needed when filter reconfiguration is performed, and operations associated with reading/processing of data from the servo region can begin immediately after the response of the analog filter 152 is reconfigured for servo operation, in an embodiment.

With continued reference to the time diagram 350, at a time t2 354, the analog filter 152 of the filter system 150 is reconfigured to provide equalization response for data operation. Also at the time t2, concurrently with reconfiguration of the analog filter 152 to provide equalization response, DC offset correction values corresponding to the new filter configuration/bandwidth are retrieved from the DC offset correction memory 153 and corresponding analog DC offset correction signals are applied to the analog filter 152. Accordingly, a data auto-zero time period is not needed when filter reconfiguration is performed, and operations associated with reading/processing of data from or writing data to the data region can begin immediately when the response of the analog filter 152 is reconfigured for data operation, in an embodiment.

Figure 4:
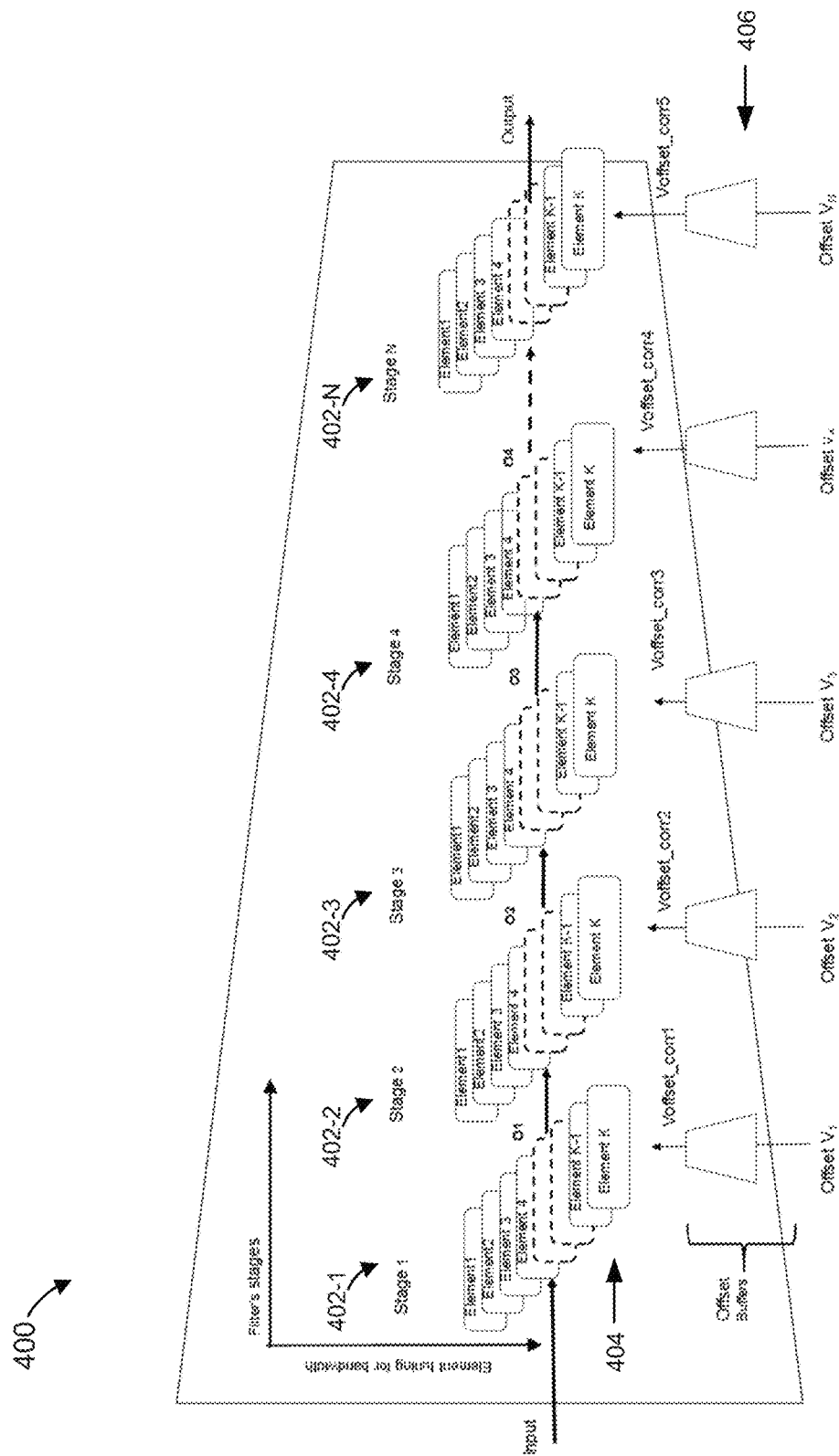
FIG. 4 is a block diagram of an example analog filter utilized with the magnetic disk drive system of FIG. 1, according to an embodiment.

FIG. 4 is a block diagram of an example analog filter 400, according to an embodiment. In an embodiment, the analog filter 400 is utilized with the magnetic disk drive system 100 of FIG. 1. For example, the analog filter 400 corresponds to the analog filter 152 of FIG. 1, in an embodiment. In another embodiment, the configurable filter 400 is utilized with a system different from the magnetic disk drive system 100 of FIG. 1. Similarly, the magnetic disk drive system 100 of FIG. 1 utilizes an analog filter different from the analog filter 400, in some embodiments.

The analog filter 400 includes one or more filter stages 402. The one or more filter stages 402 are cascaded to provide the overall output of the analog filter 402, in an embodiment. Connectivity topology of the filter stages 402 is configurable to shape overall response of the analog filter 402, in an embodiment. In an embodiment, respective filter stages 402 are configurable to be active or not active for particular filter configurations to provide a desired overall response of the analog filter 402. For example, in a particular configuration of the analog filter 400, one or more of the filter stages 402 are disable or bypassed. Additionally or alternatively, the order in which one or more active filter stages 402 are connected is configurable. For example, an input path to the analog filter 400 is configurable to be routed to a particular filter stage 402, in an embodiment. Additionally or alternatively, respective responses of one or more of the filter stages 402 are configurable, in some embodiments.

In an embodiment, each of the one or more filter stages 402 includes a plurality of filter elements 404. The filter elements 404 in the filter stages 402 are independently selectable, and the selection of the filter elements 404 in each of the filter stages 402 determines the overall bandwidth of the analog filter 400, in an embodiment. In an embodiment, the analog filter 402 is controllable to select a same combination of one or more elements 404 in each of the active filter stages 402. For example, in an embodiment, a control signal provided to the analog filter 402 selects a same combination of one or more filter elements 404 in each of the active filter stages 402. In another embodiment, respective different combinations of one or more filter elements 404 are selected in at least some of the active filter stages 402. In an embodiment, different filter elements 404 have different bandwidths, and a particular one of the filter elements 404 is selected to provide a particular bandwidth. In another embodiment, multiple filter elements 404 are selected, and the combination of the multiple selected filter elements 404 is used to provide the particular bandwidth, for example by combining respective outputs of the multiple selected filter elements 404 in other suitable manners.

The analog filter 400 additionally includes a plurality of buffers 406, in an embodiment. In another embodiment, the buffers 406 are external to the filter 400. In an embodiment, inputs of the buffers 406 are coupled to outputs of one or more DACs (e.g., the DAC 154 of FIG. 1) that convert DC offset correction values retrieved from a memory (e.g., the DC offset correction memory 153) to analog signals. Respective outputs of the buffers 406 are coupled to filter elements 404 of respective filter stages 402 of the filter 400 to drive the filter elements 404 to compensate the DC offsets introduced by the filter elements 404. The buffers 406 are configured to shield the filter elements 404 from being directly loaded by the DAC 154 and thereby ensure that the response characteristics of the analog filter 400 are not affected by generally varying impedance at outputs the DAC 154, in an embodiment. Further, as will be explained in more detail below, in an embodiment, circuit architecture of the elements 404 and the buffers 406 ensures that the DC offset correction signals needed by the elements 404 in particular filter configurations are substantially invariant of drifts in temperature and/or current density in the elements 404 throughout operation of the analog filter 400. Accordingly, such architecture ensures that DC offset correction values determined during one-time calibration (e.g., at power up) remain valid throughout operation of the filter 400 even if temperature and/or current density changes in the filter elements 404, in an embodiment. In some embodiments, the buffers 406 are omitted and DC offset correction signals are provided directly from the outputs of the one or more DACs to the filter elements 404.

Figure 5:
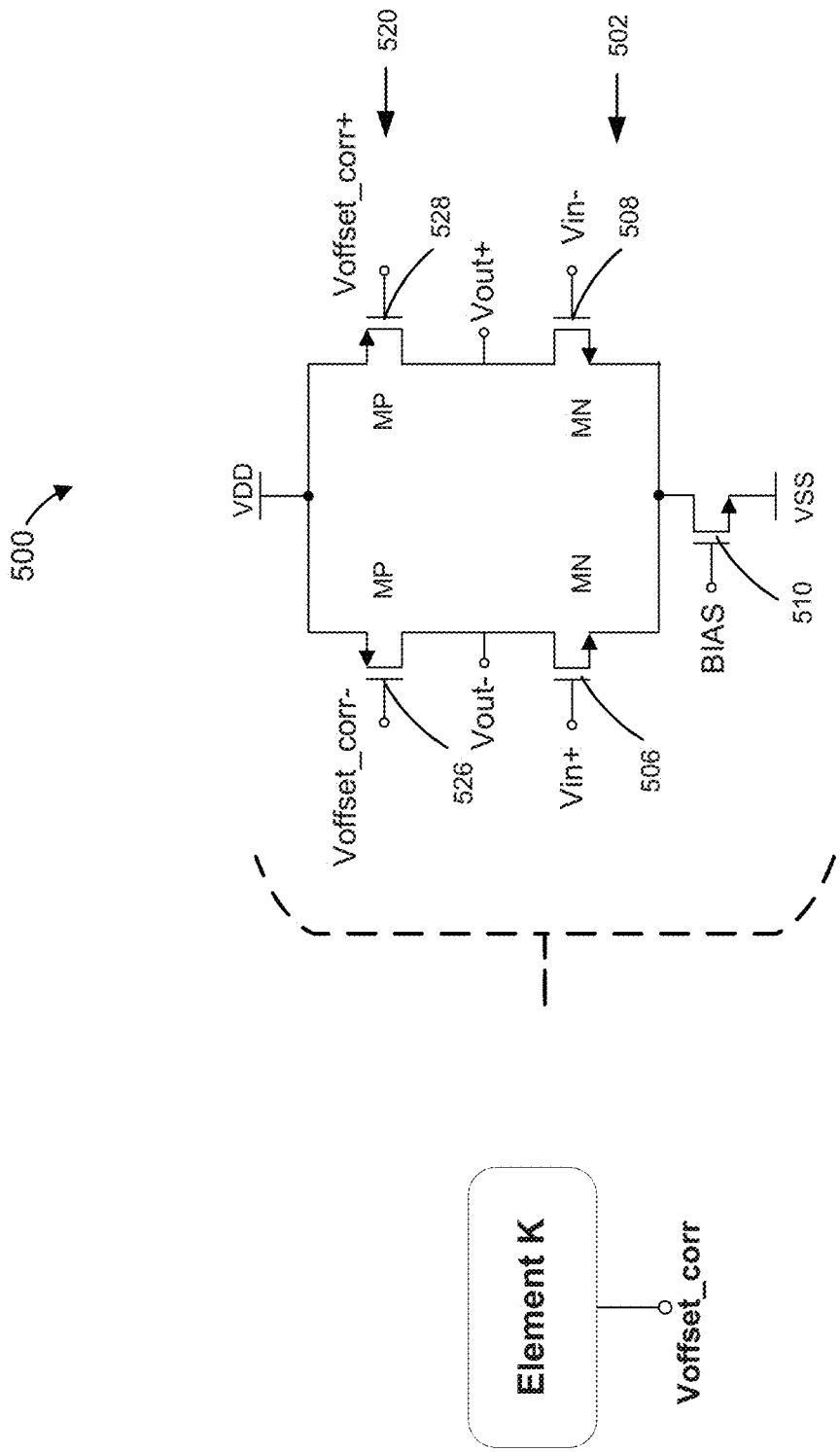
FIG. 5 is a circuit diagram of a filter element utilized with the analog filter of FIG. 4, according to an embodiment.

FIG. 5 is a circuit diagram of a filter element 500, according to an embodiment. In an embodiment, each filter element 404 of the filter 400 is structured as the filter element 500. The filter element 500 includes an operational transconductance amplifier (OTA) 502. The OTA 502 includes an n-channel metal oxide semiconductor (NMOS) differential pair (MN) having a first NMOS transistor 506 and a second NMOS transistor 508. A differential input voltage is applied across gate terminals of the NMOS transistors 506, 508. A differential output is generated across drain terminals of the NMOS transistors 506, 508. A bias voltage is provided to source terminals of the NMOS transistors 506, 508 via an NMOS transistor 510.

With continued reference to FIG. 5, the filter element 500 also includes a p-channel metal oxide semiconductor (PMOS) differential pair 520 having a first PMOS transistor 526 and a second PMOS transistor 528. A differential offset correction voltage is applied across gate terminals of the PMOS transistors 526, 528. In this implementation, transconductance gain of the filter element 500 from the ports via which offset correction voltage is applied to the filter element 500 (i.e., the gate terminals of the PMOS pair 520) to the output ports of the filter element 500 (i.e., the drain terminals of the NMOS pair 504), given by a gain of the PMOS pair (GM-PMOS) divided by a gain of the NMOS pair (GM-NMOS), is substantially invariant to the bias (or current density) and temperature of the filter element 500. Accordingly, the offset correction voltage provided to the filter element 500 need not vary with varying current density and temperature of the filter element 500, in an embodiment. Consequently, an offset correction value initially (e.g., at power up) determined for the filter element 500 for a particular configuration of the analog filter 400 remains valid throughout operation of the analog filter 400, in an embodiment.

Figure 6:
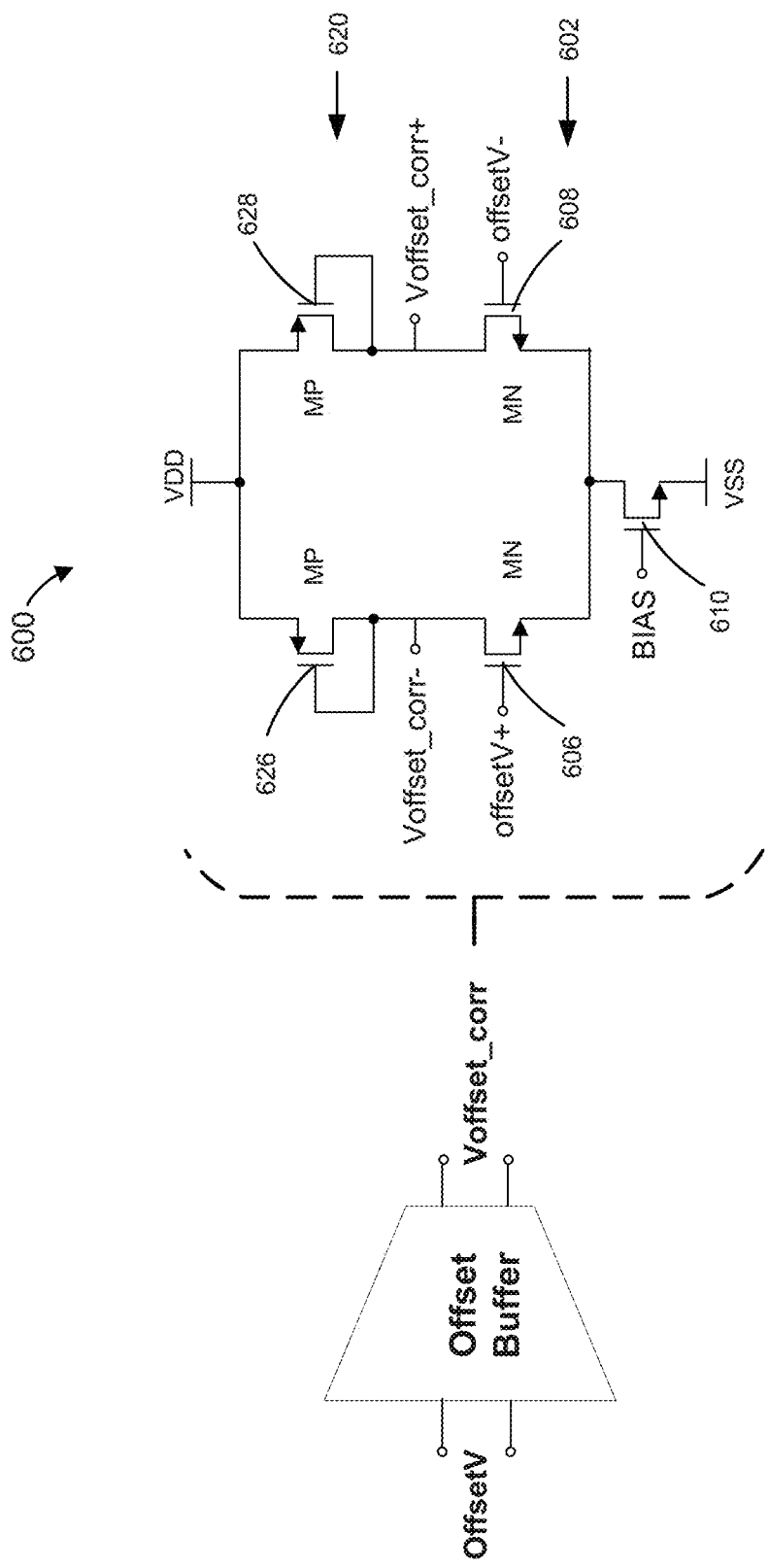
FIG. 6 is a circuit diagram of a buffer utilized with the analog filter of FIG. 4, according to an embodiment.

FIG. 6 is a circuit diagram of a buffer 600, according to an embodiment. In an embodiment, each buffer 406 of the filter 400 is structured as the buffer 600. The buffer 600 has a similar architecture to the filter element 500 of FIG. 5, in an embodiment. For example, the buffer 600 is a scaled replica of the filter element 500 of FIG. 5, in an embodiment. The buffer 600 includes an NMOS differential pair (MN) having a first NMOS transistor 606 and a second NMOS transistor 608. An offset correction voltage at an output of a DAC is applied as a differential voltage across gate terminals of the NMOS transistors 606, 608. A bias voltage is provided to source terminals of the NMOS transistors 606, 608 via an NMOS transistor 610. The buffer 600 also includes a PMOS differential pair (MP) 620 having a first PMOS transistor 626 and a second PMOS transistor 628. The PMOS transistor 626 and the PMOS transistor 628 are diode-connected to generate an offset correction voltage Voffset_corr as a differential voltage across drain terminals of the NMOS transistors 606, 608. With reference to FIGS. 6 and 5, the drain terminals of the NMOS transistors 606, 608 are coupled to the gate terminals of the PMOS differential pair 520 of the filter element 500 to provide offset correction voltage to the filter element 500, in an embodiment.

Figure 7:
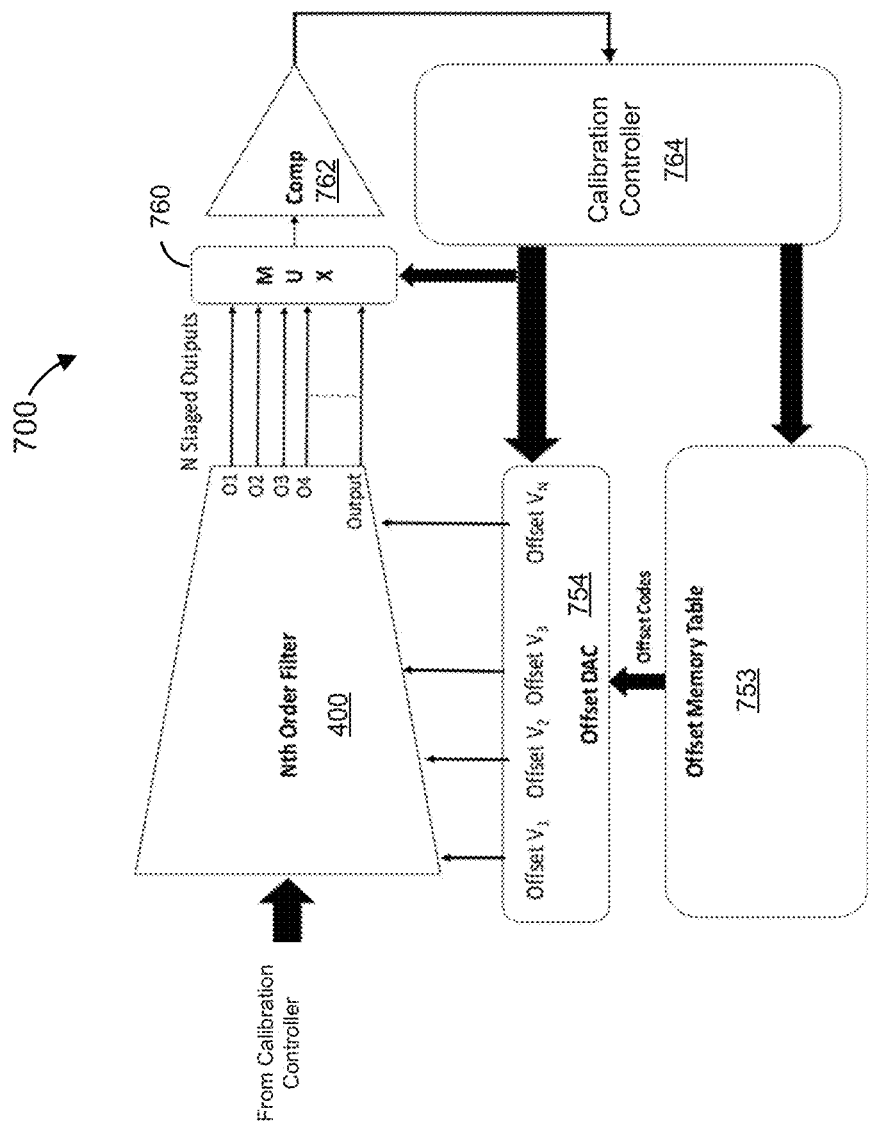
FIG. 7 is a block diagram illustrating a filter system in calibration mode, according to an embodiment.

FIG. 7 is a block diagram illustrating a filter system 700 in calibration mode, according to an embodiment. In an embodiment, the filter system 400 corresponds to the filter system 150 of FIG. 1. The filter system 700 includes the analog filter 400 of FIG. 4, in an embodiment. The filter system 700 includes an analog filter different from the analog filter 400 of FIG. 4 in place of the analog filter 400, in another embodiment. The analog filter 400 (or other analog filter) is coupled to a DC offset correction memory 753 via a DAC 754. With reference to FIGS. 7 and 1, the analog filter 400 corresponds to the analog filter 152, the DC offset correction memory 753 corresponds to the DC offset correction memory 153, and the DAC 754 corresponds to the DAC 154, in an embodiment.

The filter system 700 additionally includes a multiplexer 760, a comparator 762 and a calibration controller 764, in an embodiment. The calibration controller 764 is configured to initiate and control a calibration procedure to determine DC offset correction values for different configurations and/or bandwidths of the analog filter 400 that may subsequently be used during operation, in an embodiment. For example, the calibration controller 764 is configured to initiate the calibration procedure at power-up of the filter system 700, in an embodiment. During the calibration procedure, the controller 764 operates to sweep multiple configurations and/or bandwidths of the analog filter 400 and to determine DC offset correction values needed for each configuration and/or bandwidth of the analog filter 400. For example, in an embodiment, the controller 764 is configured to sweep all possible bandwidths and filter topology configurations so that a DC offset correction value is determined for any possible filter bandwidth and filter topology combinations. In another embodiment, the controller 764 is configured to sweep a subset of all possible bandwidths and filter topology configurations so that a DC offset correction value is determined for only those filter bandwidth and filter topology combinations that are expected to be employed during operation of the filter system 700, for example.

In an embodiment, the controller 764 is configured to progressively calibrate the filter elements 404 of each filter stage 402 for one or more filter configurations and bandwidths that are expected to be utilized during operation of the analog filter 400. The one or more filter configurations for which calibration is to be performed is preconfigured in the filter system 700 or is user-configurable/programmable, in various embodiments. For example, in an embodiment, the filter 700 includes one or more registers or other memory components set to indicate user-specified filter configuration modes (e.g., data mode and servo mode) that are expected to be utilized during operation of the analog filter 400. During calibration, the controller 764 determines respective DC offset correction codes corresponding to respective filter configurations and stores the respective DC offset correction codes in the memory 753 for subsequent use during operation of the analog filter 400. For example, in an embodiment, the controller 756 stores the determined DC offset correction codes at particular memory locations, in the memory 753, that are associated with the corresponding filter configurations. In an embodiment, the controller 764 provides the determined DC offset correction codes to be stored in the memory 753 to a memory controller (not shown) associated with the memory 753, and the memory controller writes the determined DC offset correction codes to the particular memory locations, in the memory 753, that are associated with the corresponding filter configurations.

In an embodiment, the controller 764 is configured to individually calibrate each filter stage 402 of the analog filter 400 to determine respective sets of DC offset correction codes for multiple bandwidths provided by each filter stage 402. To calibrate a particular filter stage 402, the controller 764 isolates the particular filter stage 402 by disconnecting the input of the particular filter stage 402 and controlling the multiplexer 760 to provide the output of the particular filter stage 402 to the comparator 462. The controller 764 then progressively selects combinations of one or more filter elements 404 of the particular filter stage 402 to tune the particular filter stage 402 to different bandwidths. For each selected combination of one or more filter elements 404, the controller 764 polls the output of the offset comparator 762 while sweeping DC offset correction codes that the controller 764 provides to the DAC 754. The DAC 754 converts the DC offset correction codes to analog DC offset correction signals (e.g., analog voltage signals) that are then provided as DC offset correction signals to the selected filter elements 404. The controller 764 continues to poll the output of the offset comparator 762 in digital domain to detect the DC offset correction code at which the output of the offset comparator 762 crosses zero, i.e., when the output is flipped from a positive value to a negative value, or vice versa, indicating that the DC offset of the selected combination of the filter elements 404 is at least substantially zeroed out. The controller 764 then writes the detected DC offset correction code to the offset correction memory 753.

After the controller 764 completes calibration of each combination of one or more filter elements 404 in the particular filter stage 402 (e.g., the first filter stage 402-1), the controller 764 begins calibration of a next filter stage 402 (e.g., the second filter stage 402-2). Accordingly, the controller 764 isolates the next filter stage 402 by disconnecting the input of the next filter stage 402 and controlling the multiplexer 760 to provide the output of the next filter stage 402 to the comparator 462. The controller 764 then progressively selects combinations of one or more filter elements 404 in the next filter stage 402, and for each selected combination of one or more filter elements 404, the controller 764 i) sweeps DC offset correction codes provided to the DAC 754, ii) detects the DC offset correction code at which the output of the offset comparator 762 crosses zero, and iii) stores the detected DC offset correction codes in the memory 753. This calibration process continues until calibration of each filter stage 402 has been completed. When the calibration process is completed, DC offset correction codes corresponding to all calibrated filter stages 402 for the entire range of bandwidths are stored in the memory 753, in an embodiment.

In an embodiment, the controller 764 performs multiple calibrations of one or more of the filter stages 402 that are expected to be utilized differently in different filter configurations. In this case, DC offset correction codes determined by the multiple calibrations are stored in the memory 753. As just an example, in the magnetic disc system 100 of FIG. 1, each of the filter stages 402-2 and 402-3 is expected to be configured in a first filter mode configuration (sometimes referred to herein as "config a") that provides equalization filter response (e.g., mirrored-zeros response) for data operation and to be configured in a second filter mode configuration (sometimes referred to herein as "config b") that provides band-pass filter response for servo operation. In other embodiments, other suitable filter response configurations are utilized to adapt to particular system requirements and/or user preferences. In an embodiment, the controller 764 performs a first calibration of the filter stage 402-2 with the stage 402-2 configured in the first filter mode configuration mode of the filter stage 402-2 for data operation, and performs a second calibration of the filter stage 402-2 with the stage 402-2 configured in the second filter mode configuration mode of the filter stage 402-2 for servo operation, in an embodiment. Thus, the controller 764 stores, in the memory 753, respective sets of DC offset correction codes for the filter stage 402-2 for each of the filter configurations, in this embodiment. Similarly, the controller 764 performs a first calibration of the filter stage 402-3 with the stage 402-3 configured in a first filter mode configuration mode of the filter stage 402-3 for data operation, and performs a second calibration of the filter stage 402-3 with the stage 402-3 configured in the second filter mode configuration mode of the filter stage 402-3 for servo operation, in an embodiment. Thus, the controller 764 stores, in the memory 753, respective sets of DC offset correction codes for the filter stage 402-3 for each of the filter configurations, in this embodiment.

In some embodiments, the controller 764 additionally performs one or more residual calibrations corresponding to one or more of the filter configurations. In an embodiment, independent calibration of each filter stage 402 is performed with a particular resolution (e.g., corresponding to a particular number of bits used for the DC offset correction code), which may result in overall residual DC offset that is higher than the particular resolution due to residual error accumulation over the individually calibrated filter stages 402. In an embodiment, a residual calibration determines DC offset correction codes that can be applied to a particular filter stage 402 (e.g., the last filter stage) to compensate for the accumulated residual DC offset error, thereby improving overall DC offset calibration. In an embodiment, whether the controller 764 performs residual calibration and for which particular filter configurations (e.g., data, servo, etc.) is user programmable or configurable. For example, in an embodiment, the analog filter 400 includes one or more user-programmable registers to indicate whether residual calibration is to be performed and, in some embodiments, specific filter configurations for which residual calibration is to be performed. To perform residual calibration for a particular filter configuration, the controller 764 configures the analog filter 400 in fully-connected state corresponding to the particular configuration. The controller 764 controls the multiplexer 760 to provide the overall output of the configured analog filter 400 to the comparator 462 and progressively selects combinations of one or more filter elements 404 in the particular filter stage 402 (e.g., the last filter stage 402) to which the residual DC offsets will be applied during operation. For each selected combination of one or more filter elements 404 in the particular filter stage 402, the controller 764 i) sweeps DC offset correction codes provided to the DAC 754, ii) detects the DC offset correction code at which the output of the offset comparator 762 crosses zero, and iii) stores the detected DC offset correction codes in the memory 753. In an embodiment, as the controller 764 sweeps through the combinations of one or more filter elements 404 during the residual calibration to determine residual DC offsets to be applied to the particular filter stage 402 (e.g., the last filter stage 402), the controller 764 provides, to the DAC 754, corresponding DC offset correction codes determined during individual stage calibration for the other filter stages 402 so that corresponding DC offset correction signals are applied to the other filter stages 402. The residual calibration process continues until calibration of the fully-connected analog filter 400 is performed for each filter response configuration, in an embodiment. When the residual calibration process is completed, DC offset correction codes corresponding to the particular filter stage 402 for filter response configuration for the entire range of bandwidths are stored in the memory 753, in an embodiment.

Figure 8:
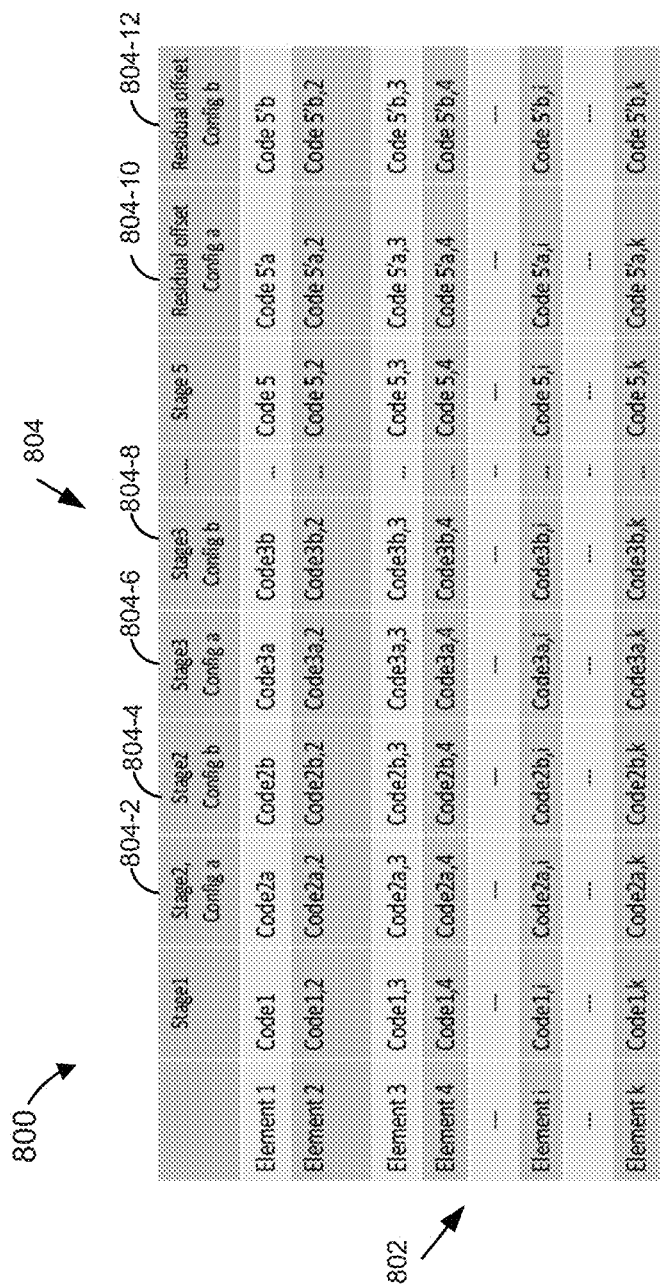
FIG. 8 is a diagram of a direct current (DC) offset memory, according to an embodiment.

FIG. 8 is a memory structure 800 diagram of the DC offset correction memory 753 of the filter system 700 of FIG. 7, according to an embodiment. The DC offset correction memory 753 is structured in other suitable manners in other embodiments. In the memory structure 800, the DC offset correction memory 753 includes a plurality of rows 802 and a plurality of columns 804. Respective rows 802 correspond to respective bandwidths determined by respective combinations of one or more filter elements 404 of the analog filter 400, in an embodiment. Respective columns 804 correspond to respective filter stage 402 of the analog filter 400, in an embodiment. In some embodiments, multiple columns of the columns 804 correspond to a particular filter stage 402, with respective ones of the multiple columns corresponding to the particular filter stage 404 corresponding to different filter response configurations. As just an example, a first filter response configuration "config a" corresponds to equalization filter response (e.g., mirrored-zeros response) for data operation in the magnetic disc drive 100 of FIG. 1 and a second filter response configuration "config b" corresponds to band-pass filter response for servo operation in the magnetic disc drive 100 of FIG. 1. In other embodiments, other suitable filter response configurations are utilized to adapt to particular system requirements and/or user preferences. Thus, for example, in the embodiment of FIG. 8, the second filter stage 402 is calibrated in two different filter response configurations. Accordingly, two columns 804 denoted in FIG. 8 as "Stage 2, Config a" 804-2 and "Stage 2, Config b" 804-4 correspond to the second filter stage 402. Similarly, in the embodiment of FIG. 8, the third filter stage 402 is calibrated in the two different filter response configurations, in the illustrated embodiment. Accordingly, two columns 804 denoted in FIG. 8 as "Stage 3, Config a" 804-6 and "Stage 3, Config b" 804-6 correspond to the third filter stage 402, in the illustrated embodiment. In an embodiment, the controller 764 stores, in the column 804-2, DC offset correction codes determined during calibration of the filter stage 402-2 with the filter stage 402-2 configured in the first filter configuration mode for data operation, and stores, in the column 804-4, DC offset correction codes determined during calibration of the filter stage 402-2 with the filter stage 402-2 configured in the second filter configuration mode for servo operation. Similarly, the controller 764 stores, in the column 804-6, DC offset correction codes determined during calibration of the filter stage 402-3 with the filter stage 402-3 configured in the first filter configuration mode for data operation, and stores, in the column 804-8, DC offset correction codes determined during calibration of the filter stage 402-3 with the filter stage 402-3 configured in the second filter configuration mode for servo operation, in an embodiment. In the embodiment of FIG. 8, the analog filter 400 is additionally calibrated in fully-connected state as described above to determine DC offset correction codes for residual DC offset error correction at the fifth filter stage 402 for each of the two filter configurations. Accordingly, additional two columns 804 denoted in FIG. 8 as "Residual offset, Config a" 804-10 and "Residual offset, Config b" 804-12 correspond to the fifth filter stage 402, in the illustrated embodiment.

Figure 9:
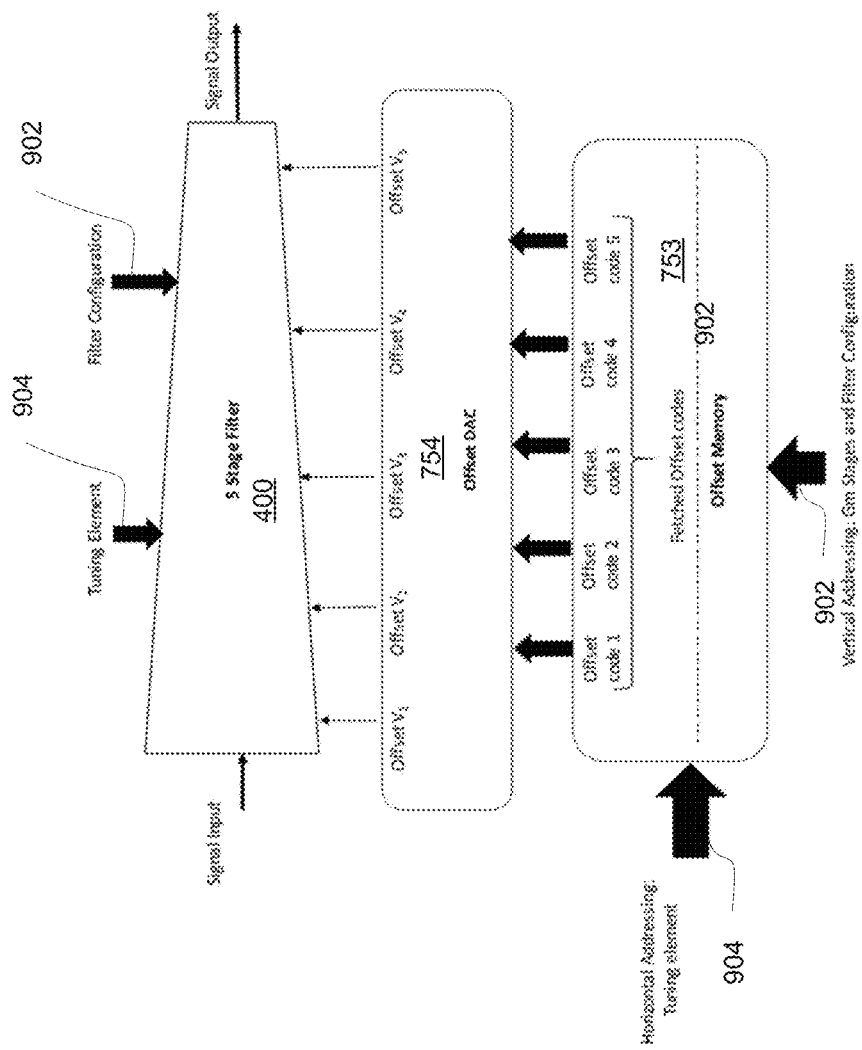
FIG. 9 is a block diagram illustrating a filter system in operation mode, according to an embodiment.

FIG. 9 is a block diagram illustrating the filter system 700 of FIG. 7 in operation mode, according to an embodiment. Calibration components that are not utilized on the filter system 700 in operation mode are not illustrated in FIG. 9. In an embodiment, the analog filter 400 is configured/ reconfigured during operation of the analog filter 400 using one or more configuration control signals. For example, the analog filter 400 is configured/reconfigured during operation of the analog filter 400 using a filter response configuration signal 902 and a tuning element control signal 904. The filter response configuration signal 902 controls configuration of the filter stages 402 and/or connectivity between the filter stages 402 to provide particular filter response transfer functions of the analog filter 400, in an embodiment. For example, the filter response configuration signal 902 selects one or more filter stages 402 to be active to generate a particular filter response, in an embodiment. The filter response configuration signal 902 comprises a filter response control word with respective bits of the filter response control word controlling configuration of respective filter stage 402, in an embodiment. The filter response control word additionally or alternatively includes one or more bits that control connectivity (e.g., order in which active filter stages 402 are connected to generate the particular filter response), in an embodiment. In other embodiments, other suitable forms of the filter response configuration signal 902 are utilized.

The tuning element control signal 904 is provided to the filter elements 404 to select particular combinations of filter element 404 in active filter stages 402 to provide particular filter bandwidths. The tuning element control signal 904 comprises a bandwidth tuning word with respective bits determining whether respective filter elements 404 are selected for the particular filter bandwidth, in an embodiment. The tuning element control signal 904 comprises a bandwidth control word with respective bits of the filter response control word controlling configuration of respective filter stage 402, in an embodiment. In other embodiments, other suitable forms of the filter response configuration signal 902 are utilized.

In an embodiment, when the analog filter 400 is configured or reconfigured during operation, DC offset correction codes determined for the corresponding filter configuration during calibration of the analog filter 400 are retrieved from the DC offset correction memory 753. For example, a memory controller (not shown) associated with the memory 753 retrieves the DC offset correction codes, in an embodiment. The retrieved DC offset correction codes are converted to analog DC offset correction signals by the DAC 754. The analog DC offset correction signals are applied to the selected one or more filter elements 404 in the active filter stages 402 for the corresponding filter configuration, in an embodiment. In some embodiments, a residual DC offset correction code for the corresponding filter configuration is additionally retrieved from the memory 753 and is converted to a residual DC offset correction analog signal. The residual DC offset correction analog signal is applied to the selected one or more filter elements 404 in the filter stage 402 that was calibrated for residual error correction, in an embodiment.

In an embodiment, the DC offset correction codes are retrieved concurrently with the analog filter being configured/reconfigured to operate in the corresponding filter configuration. In an embodiment, the DC offset correction codes are automatically retrieved from the memory 753 by indexing the memory 753 using the one or more configuration control signals that are concurrently used to configure the analog filter to operate in the particular filter configuration. For example, referring to FIG. 8, in an embodiment, the filter response configuration signal 902 is used as an address pointer to a particular column 804 of the memory 753 for each of the filter stages 402 of the analog filter 400 and the tuning element control signal 904 is used as an address pointer to a particular row 802 for each of the filter stages 402 of the analog filter 400, in an embodiment. In other embodiments, the one or more configuration control signals are used to index the memory 753 is other suitable manners.

Figure 10:
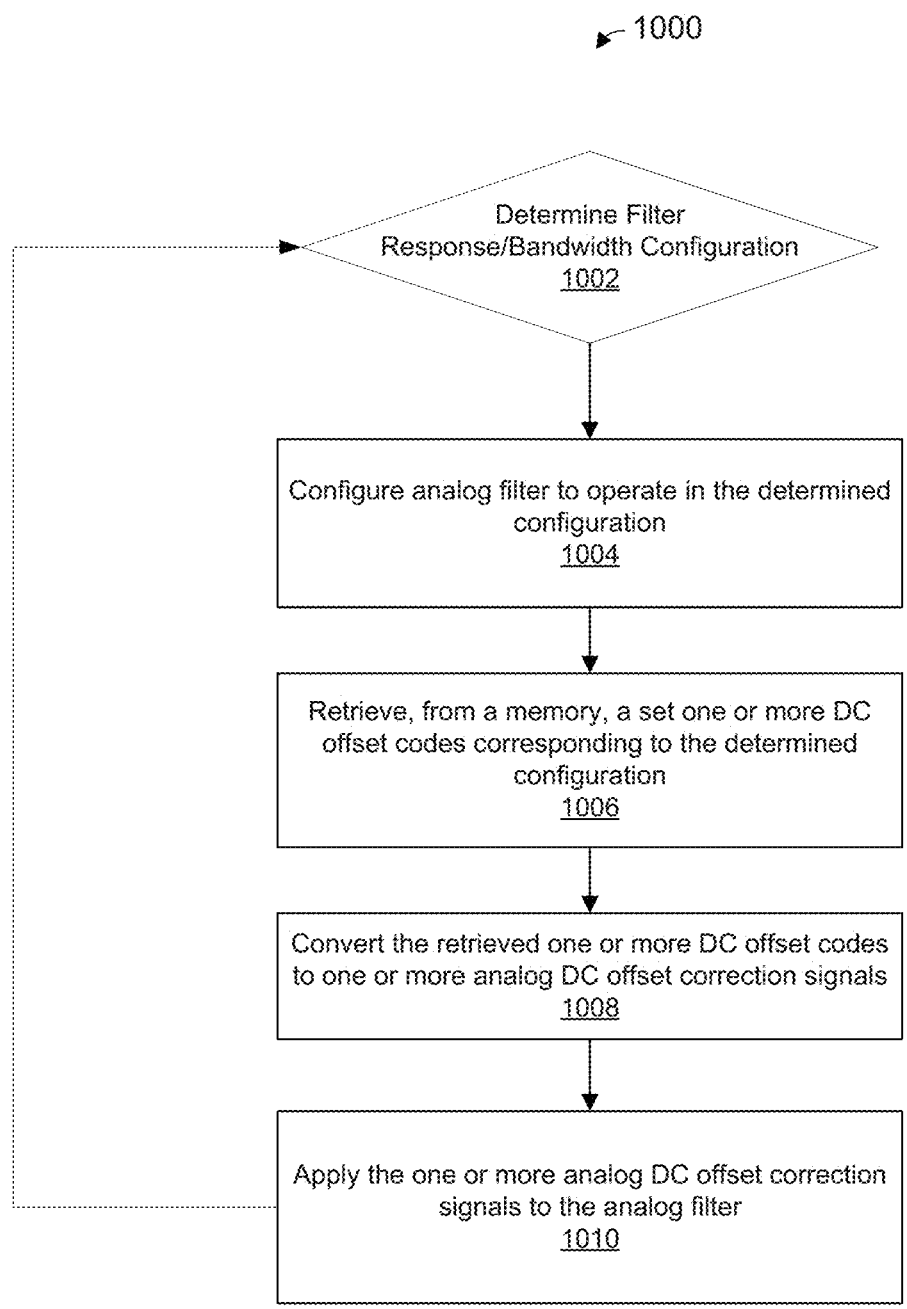
FIG. 10 is a flow diagram of an example procedure for operating an analog filter as configuration of the analog filter changes throughout operation, according to an embodiment.

FIG. 10 is a flow diagram of an example procedure 1000 for operating an analog filter as configuration of the analog filter changes throughout operation, according to an embodiment. In an embodiment, the filter system 150 of the magnetic disk drive system 100 of FIG. 1 is configured to implement the procedure 1000 to operate the analog filter 152. In another embodiment, the filter system 150 of the magnetic disk drive system 100 of FIG. 1 is configured to implement a suitable procedure different from the method 1000 to operate the analog filter 152. Similarly, the procedure 1000 is implemented by filter systems different from the filter system 150 of FIG. 1 and/or is implemented in a system different from the magnetic disc drive system 100 of FIG. 1, in other embodiments.

At a block 1002, filter response and/or bandwidth configuration is determined. For example, the filter response and/or bandwidth configuration is determined based on the filter configuration control signal 902 and/or tuning element control signal 904 of FIG. 9, in an embodiment. In an embodiment, block 1002 includes determining a filter mode (e.g., service mode or data mode) in which the filter is to operate. The filter mode is indicated by the filter configuration control signal 902 or is determined automatically based on current state of system operation, for example, in an embodiment. In other embodiments, the filter response and/or bandwidth configuration is determined based on other suitable control inputs or in other suitable manners.

At block 1004, the filter is configured to provide the filter response and/or bandwidth corresponding to the configuration determined at block 1002. In various embodiments, to configure the filter at block 1004, one or more of the following is performed: i) one or more stages of the analog filter are activated, disabled and/or bypassed, ii) filter input is routed to a particular one of the one or more filter stages, iii) the order in which the filter stages are connected is configured, iv) one or more particular filter elements in one or more filter stages are selected, etc.

At block 1006, a set of one of more DC offset correction codes corresponding to the filter configuration determined at block 1002 are automatically retrieved from a DC offset correction memory. In an embodiment, specific memory locations from which the one or more DC offset correction codes are to be retrieved are determined by the control signals based on which the filter configuration is determined at block 1002. Retrieval of the one or more DC offset correction codes at block 1006 is performed automatically, concurrently with configuration of the filter at block 1004 and transparently to the user, in an embodiment. For example, for each particular active filter stage indicated by the filter configuration control signal 902 and particular filter element (or combination of filter elements) indicated by the tuning element control signal 904, a DC offset correction code is automatically retrieved from a memory location indexed by a first address pointer corresponding to the particular filter stage and a second address pointer corresponding to the particular filter element, in an embodiment. Referring for example to FIG. 8, for each particular active filter stage indicated by the filter configuration control signal 902 and particular filter element (or combination of filter elements) indicated by the tuning element control signal 904, the DC offset correction memory 800 is indexed vertically by the particular filter stage that determines column 804 of the DC offset correction memory 800 and indexed horizontally (e.g., row-wise) by the particular filter element (or combination of filter elements) that determines a particular row 802, in an embodiment. In an embodiment in which user-configurable/programmable filter configuration modes (e.g., servo mode and data mode) are utilized, the DC offset correction code corresponding to a particular filter stage is automatically retrieved from the column corresponding to the particular filter stage and the particular filter configuration mode depending on the particular configuration determined at block 1102. Thus, for example, referring again to FIG. 8, when the determined filter configuration corresponds to a first filter mode configuration for which the filter was calibrated (e.g., config a for data operation), the DC offset correction codes for the filter stages 402-2 and 402-3 are automatically retrieved from the column 804-2 and 804-6, respectively. On the other hand, when the determined filter configuration corresponds to a second filter mode configuration for which the filter was calibrated (e.g., config b for servo operation), the DC offset correction codes for the filter stages 402-2 and 402-3 are automatically retrieved from the column 804-4 and 804-8, respectively. In an embodiment, based on user configured/programmed settings for residual calibration, for the particular filter stage 402 (e.g., the last filter stage 402) for which residual calibration was performed, the DC offset correction codes are automatically retrieved from the residual offset column 804-10 for data operation or 804-12 for servo operation, instead of the column corresponding to the individually calibrated particular filter stage 402. Indexing of the DC offset correction memory is performed automatically and transparently using the filter configuration control signal 902 and the tuning element control signal 904, in an embodiment. Thus, as just an example, as the filter is switched from data mode to servo mode at the start of a servo wedge, filter configuration control word specific to servo mode and tuning-element word specific to the current data-rate/bandwidth are used to index the column and rows, respectively, in the DC offset correction memory, in an embodiment. As another example, as the filter is switched from servo mode to data mode at the start of a data wedge, filter configuration control word specific to data mode and tuning-element word specific to the current data-rate/bandwidth are used to index the column and rows, respectively, in the DC offset correction memory, in an embodiment.

At block 1008, the one or more DC offset correction codes retrieved from the DC offset correction memory at block 1006 are converted to analog DC offset correction signals. For example, the DAC 754 of FIG. 9 converts the one or more DC offset correction codes to analog DC offset correction signals. In other embodiments, the one or more DC offset correction codes are converted to analog DC offset correction signals in other suitable manners. For example, respective ones of multiple DACs convert respective DC offset correction codes to analog DC offset correction signals, in some embodiments.

At block 1010, the one or more analog DC offset correction signals generated at block 1008 are applied to the one or more filter stages of the analog filter. In an embodiment, the one or more analog DC offset correction signals are applied to selected filter elements 404 in the active stages 402 in the filter configuration determined at block 1002. The analog filter is operated in the configuration determined at block 1002 while applying the one or more analog DC offset correction signals to the one or more filter stages of the analog filter, in an embodiment.

Subsequently, a new filter response/bandwidth configuration is determined at block 1002, for example as the filter is switched (e.g., from data to servo operation or vice-versa) and/or as the bandwidth of the filter changes to adapt to a changing data rate. Blocks 1004-1010 are then performed for the new filter response/bandwidth configuration, and so on, in an embodiment. In an embodiment, because the one or more DC offset correction codes for the filter configuration determined at block 1002 are retrieved from the DC offset correction memory at block 1006 automatically and concurrently with the filter being configured at block 1004, the appropriate DC offset correction signals are ready to be applied to the appropriate filter stages simultaneously with the filter being ready to be operated in the filter configuration (e.g., at the start of a servo wedge or the start of a data wedge).

Figure 11:
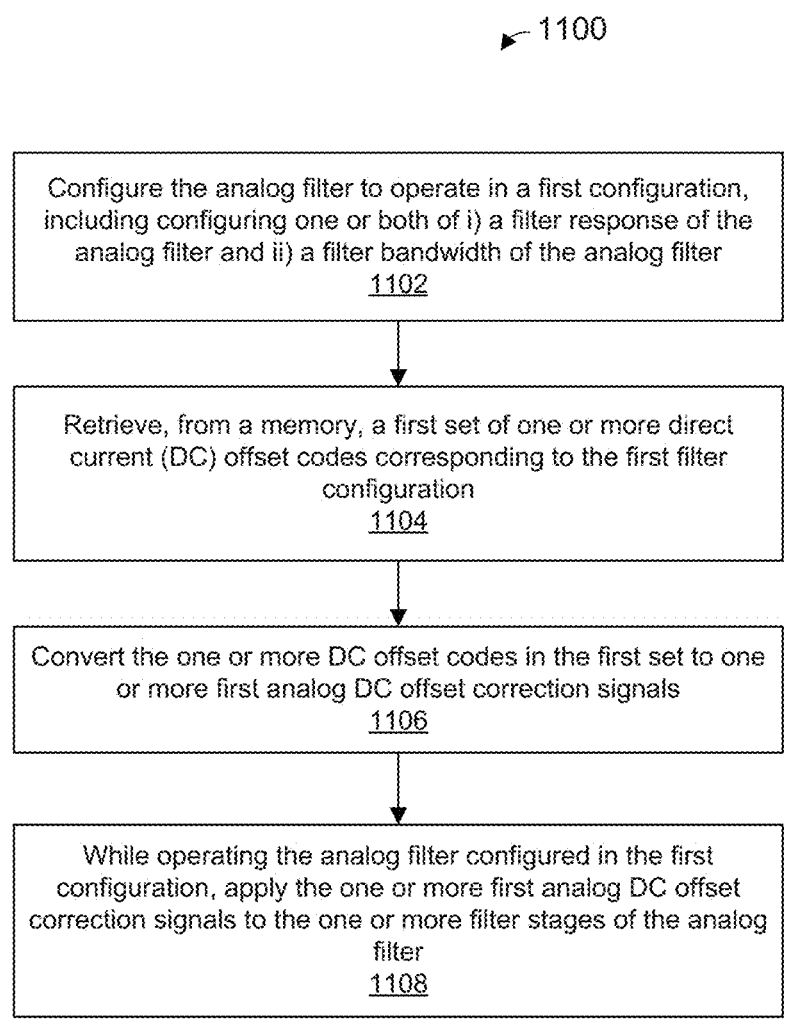
FIG. 11 is a flow diagram of an example method of operating an analog filter having one or more filter stages, according to an embodiment.

FIG. 11 is a flow diagram of an example method 1100 of operating an analog filter having one or more filter stages, according to an embodiment. In an embodiment, the filter system 150 of the magnetic disk drive system 100 of FIG. 1 is configured to implement the method 1100 to operate the analog filter 152. In another embodiment, the filter system 150 of the magnetic disk drive system 100 of FIG. 1 is configured to implement a suitable method different from the method 1100 to operate the analog filter 152. Similarly, the method 1100 is implemented by filter systems different from the filter system 150 of FIG. 1 and/or is implemented in a system different from the magnetic disc drive system 100 of FIG. 1, in other embodiments.

At block 1102, the analog filter is configured to operate in a first filter configuration. In an embodiment, the analog filter 400 of FIG. 4 is configured to operate in the first filter configuration, in an embodiment. In another embodiment, a suitable analog filter different from the analog filter 400 of FIG. 4 is configured to configured to operate in the first filter configuration. In an embodiment, the first filter configuration corresponds to a data operation mode in the magnetic disc drive system 100 of FIG. 1. In another embodiment, the first filter configuration corresponds to another mode of operation, or corresponds to a mode of operation in a system different from the magnetic disc drive system 100 of FIG. 1. In an embodiment, block 1102 includes configuring one or both of i) a filter response of the analog filter and ii) a filter bandwidth of the analog filter. For example, block 1102 includes configuring the filter response of the analog filter with mirrored zeros to provide equalization response for the data operation mode of operation, in an embodiment.

At block 1104, a first set of one or more direct current (DC) offset correction codes corresponding to the first filter configuration is retrieved from a memory. For example, the first set of one or more DC offset correction codes is retrieved from the memory 753 of FIGS. 7-9, in an embodiment. In another embodiment, the first set of one or more DC offset correction codes is retrieved from a suitable memory different from the memory 753 of FIGS. 7-9. In an embodiment, the first set of one or more DC offset correction codes at block 1104 are retrieved concurrently with configuring the analog filter to operate in the first configuration at block 1102. In an embodiment, the first set of one or more DC offset correction codes corresponding to the first filter configuration is retrieved at block 1104 by indexing the memory using one or more configuration control signals that are concurrently used at block 1102 to configure the analog filter to operate in the first filter configuration.

At block 1106, the one or more DC offset correction codes in the first set are converted to one or more first analog DC offset correction signals. For example, the DAC 754 of FIG.

9 converts the one or more DC offset correction codes in the first set to analog DC offset correction signals. In other embodiments, the one or more DC offset correction codes in the first set are converted to one or more first analog DC offset correction signals in other suitable manners. For example, respective ones of multiple DACs convert respective DC offset correction codes in the first set to first analog DC offset correction signals, in some embodiments.

At block 1108, the one or more first analog DC offset correction signals are applied to the one or more filter stages of the analog filter. In an embodiment, the one or more first analog DC offset correction signals are applied to selected filter elements 404 in the active stages 402 in the first filter configuration. The analog filter is operated in the first configuration while applying the one or more first analog DC offset correction signals to the one or more filter stages of the analog filter, in an embodiment.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any computer readable memory such as on a magnetic disk, an optical disk, or other storage medium, in a RAM or ROM or flash memory, processor, hard disk drive, optical disk drive, tape drive, etc. The software or firmware instructions may include machine readable instructions that, when executed by one or more processors, cause the one or more processors to perform various acts.

When implemented in hardware, the hardware may comprise one or more of discrete components, an integrated circuit, an application-specific integrated circuit (ASIC), a programmable logic device (PLD), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method of operating an analog filter having a plurality of filter stages, the method comprising:
   configuring, using one or more filter configuration control signals, the analog filter to operate in a first filter configuration, including configuring the analog filter at least by one or more of i) controlling one or more particular filter stages, among the plurality of filter stages of the analog filter, to be active for operation in the first filter configuration, ii) controlling one or more particular filter stages, among the plurality of filter stages of the analog filter, to be inactive or bypassed for operation in the first filter configuration and iii) configuring an order in which one or more filter stages, among the plurality of filter stages of the analog filter, are connected for operation in the first filter configuration;
   retrieving, from a memory, a first set of one or more direct current (DC) offset correction codes associated with the first filter configuration;
   converting, with one or more digital to analog converters (DACs), the one or more DC offset correction codes in the first set to one or more first analog DC offset correction signals; and
   while operating the analog filter configured in the first filter configuration, applying the one or more first analog DC offset correction signals to the plurality of filter stages of the analog filter.

2. The method of claim 1, wherein retrieving the first set of one or more DC offset correction codes comprises retrieving the first set of one or more DC offset correction codes concurrently with configuring the analog filter to operate in the first filter configuration.

3. The method of claim 1, wherein
   retrieving the first set of one or more DC offset correction codes associated with the first filter configuration includes indexing the memory using the one or more configuration control signals.

4. The method of claim 3, wherein
   the one or more configuration control signals include a bandwidth tuning word and a filter response control word, and
   retrieving the first set of one or more DC offset correction codes comprises using i) the bandwidth tuning word as a first memory address pointer and ii) the filter response control word as a second address pointer, wherein the first address pointer and the second address pointer determine one or more memory locations, in the memory, from which to retrieve respective DC offset correction codes of the one or more DC offset correction codes.

5. The method of claim 1, wherein applying the one or more first analog DC offset correction signals to the plurality of filter stages of the analog filter includes applying the one or more DC offset correction signals to the plurality of filter stages via one or more buffers to reduce impedance variance at inputs to filter elements of the plurality of filter stages.

6. The method of claim 1, wherein
   a particular filter stage, among the plurality of filter stages, includes a filter element comprising an operational transconductance amplifier (OTA) coupled to a current load, and
   applying the one or more first analog DC offset correction signals to the plurality of filter stage includes applying a particular first analog DC offset correction code to the OTA of the filter element of the particular filter stage via the current load.

7. The method of claim 1, further comprising
   reconfiguring the analog filter to operate in a second filter configuration;
   retrieving, from the memory, a second set of one or more DC offset correction codes associated with the second filter configuration;
   converting, with the one or more DACs, the one or more DC offset correction codes in the second set to one or more second analog DC offset correction signals;
   applying the one or more second analog DC offset correction signals to the plurality of filter stages of the analog filter; and
   operating the analog filter configured in the second filter configuration while applying the one or more second analog DC offset correction signals to the plurality of filter stages of the analog filter.

8. The method of claim 1, further comprising, prior to operation of the analog filter
   calibrating the analog filter in a plurality of filter configurations to determine respective sets of DC offset correction codes corresponding to respective filter configurations of the plurality of filter configurations, and
   storing, in the memory, the respective sets of DC offset correction codes for subsequent use during operation of the analog filter.

9. The method of claim 8, wherein calibrating the analog filter includes independently calibrating each filter stage of the plurality of filter stages of the analog filter, wherein calibrating a particular filter stage of the plurality of filter stages includes isolating an output of the particular filter stage;
progressively tuning the particular filter stage to a plurality of bandwidths; and
for each bandwidth of the plurality of bandwidths,
determining a DC offset correction code at which the output of the particular filter stage crosses zero, and storing the determined DC offset correction code in the memory.

10. The method of claim 9, wherein calibrating the analog filter further includes:

selectively calibrating the analog filter in a fully connected state to determine a set of one or more DC offset correction codes for residual DC offset correction, and
storing, in the memory, the set of one or more DC offset correction codes for residual DC offset correction.

11. A filter system, comprising:

an analog filter including a plurality of filter stages,
a memory configured to store direct current (DC) offset correction codes associated with a plurality of filter configurations,
a memory controller configured to, when the analog filter is configured, using one or more configuration control signals, to operate in a first filter configuration among the plurality of filter configurations, the analog filter being configured at least by one or more of i) controlling one or more particular filter stages, among the plurality of filter stages of the analog filter, to be active for operation in the first filter configuration, ii) controlling one or more particular filter stages, among the plurality of filter stages of the analog filter, to be inactive or bypassed for operation in the first filter configuration and iii) configuring an order in which one or more filter stages, among the plurality of filter stages of the analog filter, are connected for operation in the first filter configuration, retrieve, from the memory, a first set of one or more direct current (DC) offset correction codes associated with the first filter configuration, and
one or more digital to analog converters (DACs) configured to convert the one or more DC offset correction codes in the first set to one or more first analog DC offset correction signals, wherein the one or more first analog DC offset correction signals are applied to the plurality of filter stages of the analog filter while the analog filter operates in the first filter configuration.

12. The filter system of claim 11, wherein the memory controller is configured to retrieve the first set of one or more DC offset correction codes while the analog filter is being configured to operate in the first filter configuration.

13. The filter system of claim 11, wherein the memory controller is configured to retrieve the first set of one or more DC offset correction codes corresponding to the first filter configuration at least by indexing the memory using the one or more configuration control signals that are used to configure the analog filter to operate in the first filter configuration.

14. The filter system of claim 13, wherein the one or more configuration control signals include a bandwidth tuning word and a filter response control word, and
the memory controller is configured to retrieve the first set of one or more DC offset using i) the bandwidth tuning word as a first memory address pointer and ii) the filter response control word as a second address pointer, wherein the first address pointer and the second address pointer determine one or more memory locations, in the memory, from which to retrieve respective DC offset correction codes of the one or more DC offset correction codes.

15. The filter system of claim 11, further comprising one or more buffers coupled between one or more outputs of the or more DACs and the plurality of filter stages to reduce impedance variance at inputs to filter elements of the plurality of filter stages.

16. The filter system of claim 11, wherein a particular filter stage, among the plurality of filter stages, includes a filter element comprising an operational transconductance amplifier (OTA) coupled to a current load, and
a particular first analog DC offset correction signal of the one or more first analog DC offset correction signals is applied the OTA of the one filter element via the current load.

17. The filter system of claim 11, wherein the memory controller is further configured to, when the filter is reconfigured to operate in a second filter configuration among the plurality of filter configurations, retrieve, from the memory, a second set of one or more direct current (DC) offset correction codes associated with the second filter configuration, and wherein
the one or more DACs are configured to convert the one or more DC offset correction codes in the second set to one or more second analog DC offset correction signals, wherein the one or more second analog DC offset correction signals are applied to the plurality of filter stages while the analog filter operates in the second filter configuration.

18. The filter system of claim 11, further comprising a calibration controller configured to, prior to operation of the analog filter, calibrate the analog filter in the plurality of filter configurations to determine respective sets of DC offset correction codes corresponding to respective filter configurations of the plurality of filter configurations, and
store, in the memory, the respective sets of DC offset correction codes for subsequent use during operation of the analog filter.

19. The filter system of claim 18, wherein the calibration controller is configured to independently calibrate each filter stage of the plurality of filter stages of the analog filter, wherein calibrating a particular filter stage of the plurality of filter stages includes isolating an output of the particular filter stage;
progressively tuning the particular filter stage to a plurality of bandwidths; and
for each bandwidth of the plurality of bandwidths,
determining a DC offset correction code at which the output of the particular filter stage crosses zero, and storing the determined DC offset correction code in the memory.

20. The filter system of claim 19, wherein the calibration controller is further configured to calibrate the analog filter in a fully connected state to determine a set of one or more DC offset correction codes for residual DC offset correction, and
storing, in the memory, the set of one or more DC offset correction codes for residual DC offset correction.

* * * * *